(12) United States Patent
Kamphuis et al.

(10) Patent No.: US 12,142,527 B2
(45) Date of Patent: *Nov. 12, 2024

(54) METHOD AND SYSTEM FOR REGULATING PLASMA DICING RATES

(71) Applicant: NXP B.V., Eindhoven (NL)

(72) Inventors: Antonius Hendrikus Jozef Kamphuis, Nijmegen (NL); Ernst Eiper, Graz (AT); Johannes Cobussen, Beuningen (NL); Chantal Claude Dijkstra, Veenendaal (NL)

(73) Assignee: NXP B.V., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,421

(22) Filed: Jun. 14, 2023

(65) Prior Publication Data

US 2023/0326796 A1    Oct. 12, 2023

Related U.S. Application Data

(62) Division of application No. 16/721,083, filed on Dec. 19, 2019, now Pat. No. 11,721,586.

(51) Int. Cl.
*H01L 21/82* (2006.01)
*G01R 31/28* (2006.01)
*H01L 21/66* (2006.01)

(52) U.S. Cl.
CPC .......... *H01L 21/82* (2013.01); *G01R 31/2831* (2013.01); *G01R 31/2856* (2013.01); *H01L 22/32* (2013.01); *H01L 22/34* (2013.01)

(58) Field of Classification Search
CPC .................................................. G01R 31/2856
See application file for complete search history.

(56) References Cited

U.S. PATENT DOCUMENTS

| | | | |
|---|---|---|---|
| 6,744,067 B1 | 6/2004 | Farnworth et al. | |
| 7,329,899 B2 | 2/2008 | Farnworth et al. | |
| 8,633,552 B1 | 1/2014 | Wissman et al. | |
| 9,252,063 B2 | 2/2016 | Khoo et al. | |
| 11,721,586 B2 * | 8/2023 | Kamphuis | H01L 22/34 257/40 |
| 2005/0151248 A1 * | 7/2005 | Shau | H01L 22/32 257/734 |
| 2014/0242780 A1 | 8/2014 | Gauldin et al. | |
| 2018/0174933 A1 | 6/2018 | Kim et al. | |
| 2019/0096875 A1 * | 3/2019 | Roh | H01L 23/5226 |

FOREIGN PATENT DOCUMENTS

EP    1360724 B1    11/2003

* cited by examiner

*Primary Examiner* — Raj R Gupta (57) ABSTRACT

Speed of plasma etching is regulated in regions prone to over-etching by providing an etch resistant structure, such as a metal saw bow, in the region. By adjusting dimensions, such as the length and width of the saw bow legs and an area defined by the saw bow legs, as well as a shape of the etch region through techniques such as chamfering, plasma etch speed in the region can be controlled with an intent to match the speed of etching in non-over-etched regions.

20 Claims, 8 Drawing Sheets

METHOD AND SYSTEM FOR REGULATING PLASMA DICING RATES

CROSS-REFERENCE TO RELATED APPLICATIONS

This application is a divisional application of a U.S. patent application entitled "METHOD AND SYSTEM FOR REGULATING PLASMA DICING RATES", having a Ser. No. 16/721,083, having a filing date of Dec. 19, 2019, having common inventors, and having a common assignee, all of which is incorporated by reference in its entirety.

BACKGROUND

Field

This disclosure relates generally to integrated circuit manufacturing, and more specifically, to providing an integrated circuit die saw bows in a saw lane crossing in order to regulate etch rate to even out slower and faster plasma etching speed during device die dicing.

Related Art

Wafer testing is a step performed during semiconductor device fabrication. During this step, which is performed before a wafer is sent to die preparation, individual integrated circuits on the wafer are tested for functional defects by applying special test patterns to them. Wafer testing is often performed by a piece of test equipment called a wafer prober. During wafer testing, probes are applied to contacts on each die on the wafer to communicate with the circuitry within the die. Test patterns can be provided to the circuitry and responses registered by the probes. The wafer prober can also exercise any test circuitry present on wafer scribe lines.

Once testing is completed, the individual device die are separated from the wafer (and neighboring device die) during a singulation process. Historically, device die were singulated from the wafer using a saw that cut through scribe lines between the die on the wafer. As device die sizes have become smaller and smaller and the number of dies on a wafer have increased, wafer singulation techniques have moved to stealth dicing and plasma dicing to allow for smaller scribe lines. These techniques do not involve sawing the die for singulation, but instead provide regions where the die can be broken apart along the scribe line.

During plasma dicing of semiconductor device die, plasma etching occurs on the material in the scribe lanes. Plasma etch rate is dependent upon aspect ratio of the etch regions and ease of local gas exchange. As the plasma etches downward, the speed of the plasma etch is slowed as it pass through the middle region of a saw bow loop due to the aspect ratio in that region, as compared to the speed of the plasma on either side of the saw bow. On the other hand, in a region where the scribe lanes cross at an intersection between die, over etching often occurs due to a higher gas exchange in that region and therefore increased etch rate in that region.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention regulate speed of plasma etching in regions prone to plasma etching acceleration by providing an etch resistant structure, such as a metal saw bow, in the region. By adjusting dimensions, such as the length and width of the saw bow legs and an area defined by the saw bow legs, as well as a shape of the etch region through techniques such as chamfering, plasma etch speed in the region can be controlled with an intent to match the speed of etching in non-accelerated regions.

Wafer testing can involve the use of test contact pads on the device die. Test pads can be configured to be disabled after the testing process. Commonly, a circuit path external to the device die is provided to connect circuitry within the device die to the test pad. The external circuit path, called a saw bow, loops through the scribe line region and is designed to be cut during singulation. Other uses for a saw bow can include connecting internal circuitry within the device die for programming purposes during the test and configuration phase while still on a wafer but disabling that functionality after singulation.

Traditionally, a saw bow is sawed through after wafer testing, so that an end customer cannot access the electronic content of the die or that the die can be placed in a non-testing mode. New die separation techniques, such as plasma dicing, do not use a sawing process. Plasma dicing employs deep silicon etch technology to singulate dies from wafers. The technology provides high quality results, design flexibility, and dices the entire wafer at the same time without die size sensitivity.

Plasma dicing can employ a dry etch process in which areas of a wafer left unmasked are attacked by a plasma.

Process gases are used to etch exposed dicing lane material and to control the vertical profile of the cut in the dicing lane. Plasma dicing can be performed to partially or completely remove all exposed silicon in the dicing lane. An advantage of the plasma dicing process over a stealth dicing process is that for certain techniques a width of the cut can be as small as, but not limited to, 4 μm, as compared to 10 μm or more for other dicing techniques, such as stealth dicing (e.g., to avoid damage to the integrated circuits in the device die).

One drawback of a plasma dicing process is that the etching speed is limited by the smallest regions within which etching is performed. Thus, a small region between saw bow "leg" conductors can slow down the entire dicing process. While a wider gap in the saw bow loop serves to alleviate this issue, there are negatives with providing a large gap between saw bow legs, including dimensional difficulties with smaller die sizes and expense in terms of area dedication.

Another concern regarding plasma dicing is that there are other regions in which the speed of the plasma etch process is accelerated. This includes regions where the dicing lanes cross at intersections between neighboring device die. The crossover region has an aspect ratio that is favorable for gas exchange and thus etches faster than other regions of the dicing lane. Embodiments of the present invention utilize the slower etching speed of regions such as between the saw bow legs to regulate the etching rate in those regions where the plasma etching is accelerated.

Figure 1:
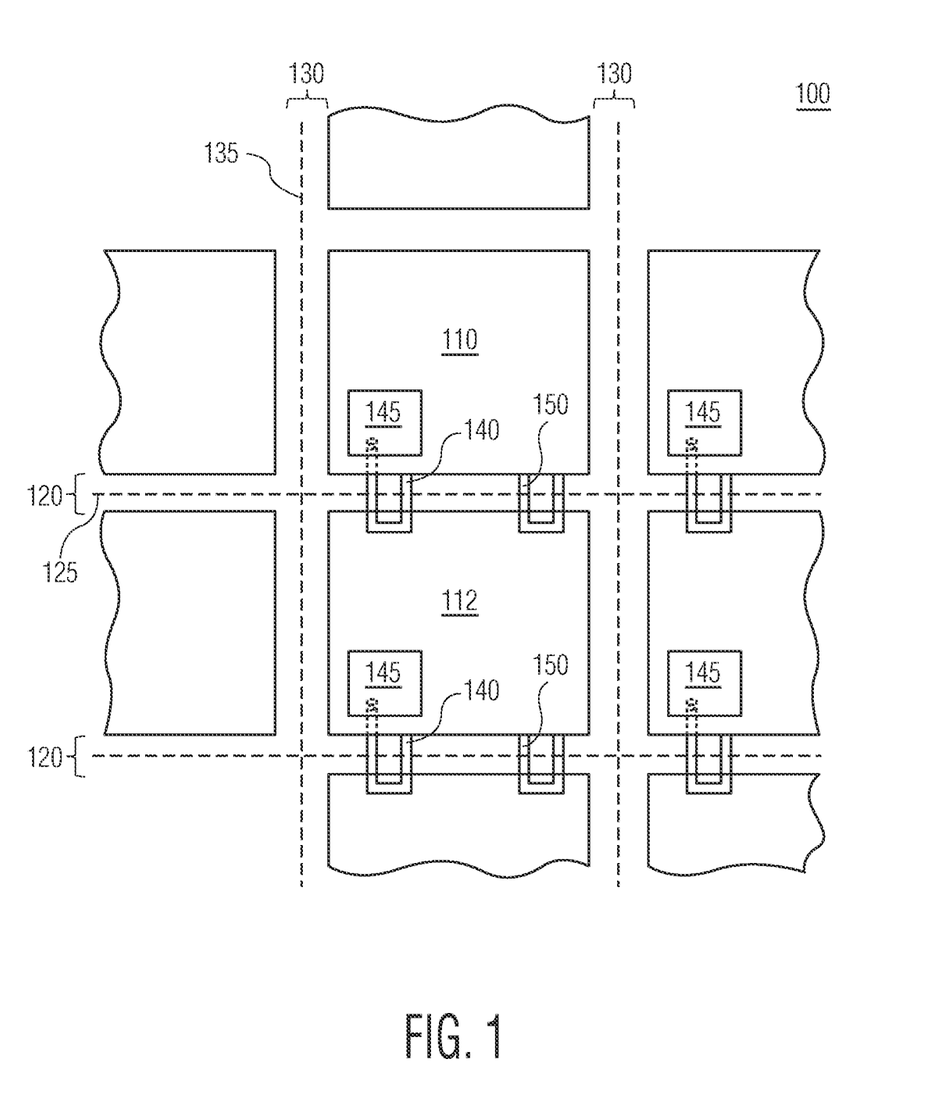
FIG. 1 is a simplified block diagram illustrating a portion of a semiconductor wafer with individual integrated circuit dies formed thereon.

FIG. 1 is a simplified block diagram illustrating a portion of a semiconductor wafer 100 with individual integrated circuit dies formed thereon. In current technology, wafer diameters of 150 mm, 200 mm, and 300 mm are common. Semiconductor wafers of these dimensions can be processed to include hundreds to several hundred-thousands of possible dies per wafer (PDPW), depending upon the nature the circuitry provided by the semiconductor device die and the nature of the processing technology used in manufacturing the semiconductor devices. The semiconductor wafer comprises a semiconductor substrate that can be any semiconductor material or combinations of materials, such as gallium arsenide, silicon germanium, silicon-on-insulator (SOI), silicon, monocrystalline silicon, the like, and combinations of the above.

FIG. 1 illustrates a repeating set of semiconductor device die 110. During processing, dicing lanes (120, 130) are provided between each formed semiconductor device die. Upon completion of the integrated circuits in the dies, and testing thereof, the individual dies are singulated from the semiconductor wafer and each other die. Singulation processes, such as those described above, are performed along saw lines 125 and 135 in dicing lanes 120 and 130, respectively.

Die 110 include examples of saw bows extending across the dicing lanes. Saw bow 140 electrically couples circuitry within device die 110 to a test pad 145 located on a surface of device die 110. During device test, a probe can be brought into contact with test pad 145, for example, to provide testing signals to integrated circuits within device die 110, to read information from those integrated circuits, or to provide instructions or data to a memory within device die 110. Test pad 145 can be formed using metallization techniques known in the art, such as sputtering and photolithography. Saw bow 150 can be used to electrically couple integrated circuits within device die 110 for testing purposes (e.g., mode select for test). The electrical paths of both saw bow 140 and 150 are designed to be severed during singulation of device dies 110 from wafer 100.

Saw bows 140 and 150 are extensions of a metal layer formed within device die 110, which can be formed through a combination of deposition and patterning techniques, as known in the art. The metal layer can include any conductive material, such as, but not limited to aluminum, aluminum-tin, copper, platinum, palladium, iridium, tantalum, titanium, tungsten, or any metal alloy, nitride or silicide thereof. The saw bows extend from a first device die region (e.g., 110), across the dicing lane (e.g., 120), and into the seal ring (not shown) of a neighboring device die region (e.g., 112). Seal rings are stress protection structures around integrated circuits and protect the internal circuit inside semiconductor chips from damage caused by the sawing of the semiconductor chips from wafers. Typical seal rings are usually formed of interconnected metal layers, dielectric layers between the metal layers, and connecting vias electrically coupling the metal layers.

Figure 2A:
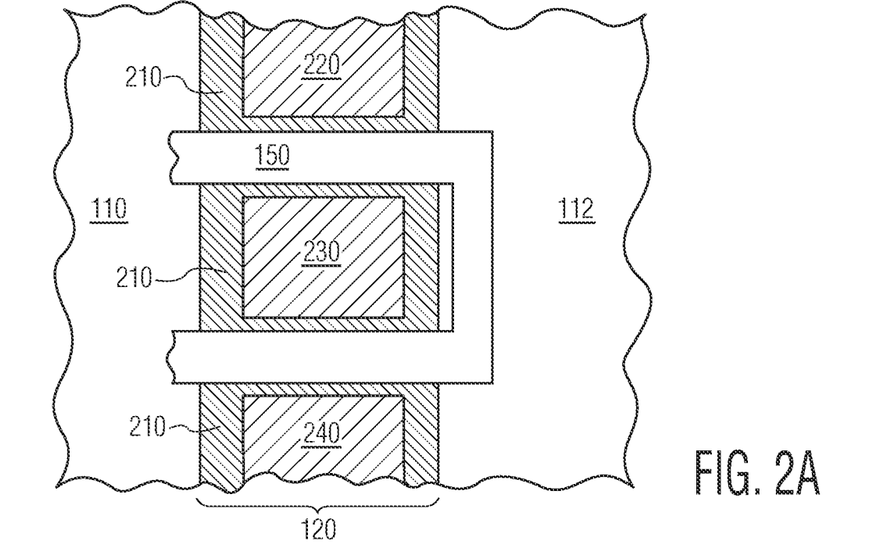
FIGS. 2A, 2B, and 2C illustrate a saw bow construction and severing process using plasma dicing of prior art structures.
Figure 2B:
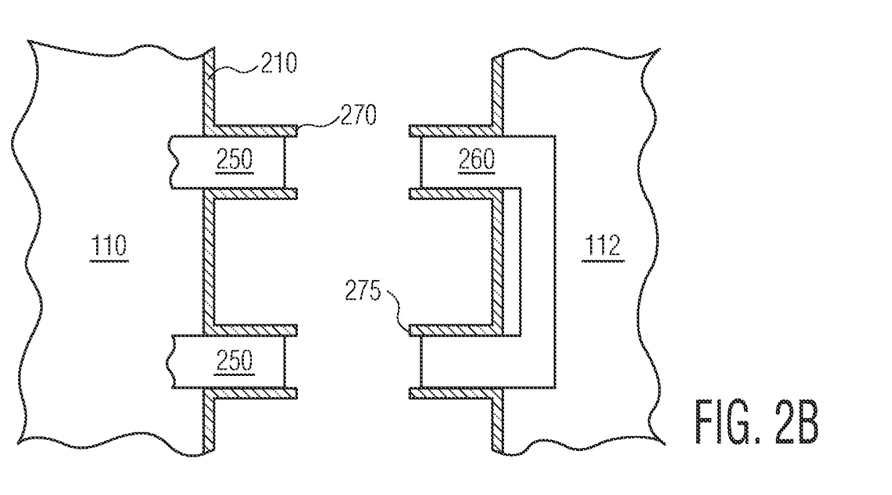
Figure 2C:
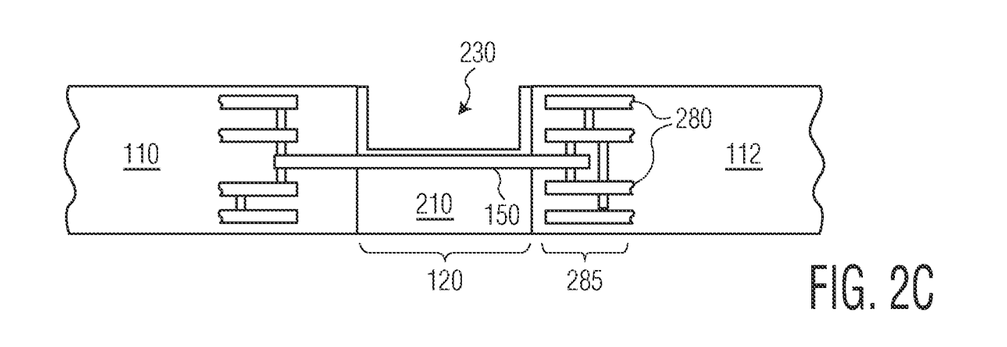

FIGS. 2A, 2B, and 2C illustrate a saw bow severing process using plasma dicing. FIG. 2A is a plan view illustrating the saw bow 150 extending across a dicing lane 120. As illustrated in FIG. 1, device die 110 has a saw bow 150 extending from a side of the device die through a dicing lane 120 and into device die region 112. Dicing lane 120 can include a dicing lane material 210 that includes wafer substrate material, such as, for example, silicon, germanium or silicon carbide. As an example, saw bow 150 can have conductive legs of a width of 2 μm extending across dicing lane 120 to a loop conductor that is 20 μm long, resulting in a 20 μm space between the conductive legs. With such a loop structure, plasma etching for the dicing process occurs in dicing lane areas 220, 230, and 240. During the etching process, the dicing lane material is removed from dicing lane areas 220, 230, and 240. As the space between the conductive legs is reduced, a time to conduct the etching process for area 230 will increase. This is discussed in greater detail below.

FIG. 2B is a simplified block diagram illustrating results of the plasma dicing after singulation of die 110 from wafer 100. As illustrated, a small amount of dicing lane material 210 remains on the surface of device die 110 facing the region where dicing lane 120 was located, as well as on surfaces of the severed saw bow. Saw bow 150 is severed into die-side pieces 250 and loop-side piece 260. As discussed above, singulating device die 110 using a plasma dicing process requires breaking apart the metal in the saw bow because that material is not etched. The breaking of the metal can result in exposed areas of metal 270 and 275.

FIG. 2C is a cross section of the saw bow region of the dicing lane after the etching process of the plasma dicing. As illustrated, saw bow 150 is an extension of one of the metal layers of die 110. The saw bow extends across dicing lane 120 and into device die region 112. Saw bow 150 extends into the seal ring region 285 of device die region 112, incorporating metal layers 280. In area 230, the etching process has removed silicon oxide material partially above the saw bow during PV etch. The remaining silicon oxide protects the metal of the saw bow during silicon plasma dicing. In addition, as illustrated in FIG. 2B, the dicing lane material is etched beyond the metal layer within the saw bow loop.

Figure 3:
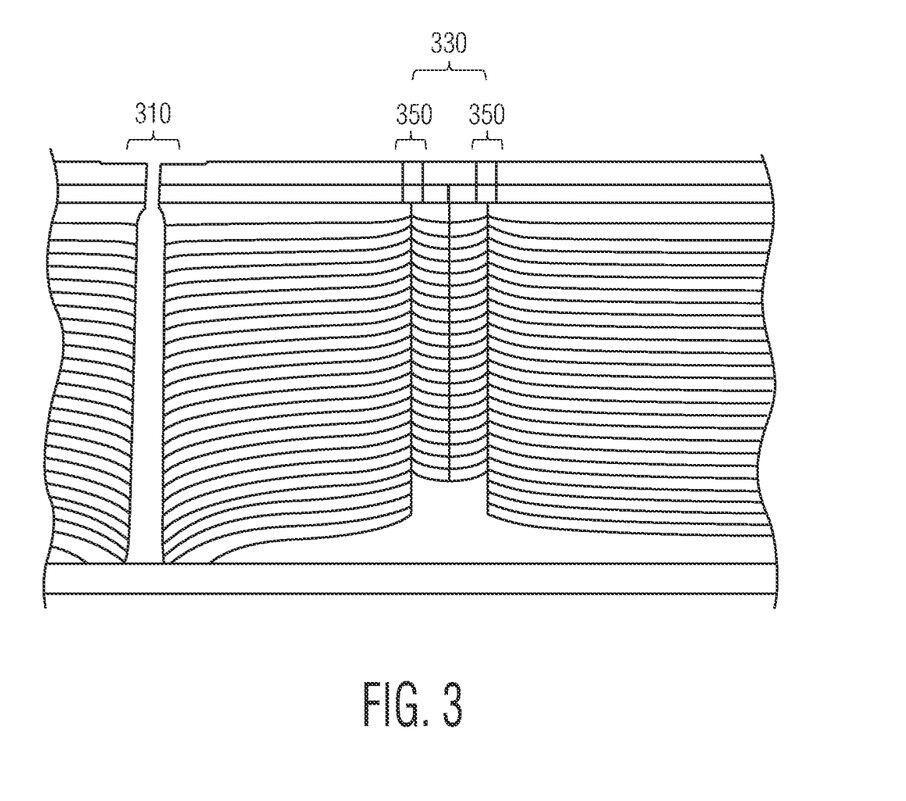
FIG. 3 is an image of the etching region along a side of a plasma diced die that illustrates differing etch rates in both a region where dicing lanes intersect and a region beneath saw bow structure.

FIG. 3 is an image of the etching region along a side of a plasma diced die that illustrates differing etch rates in both a region where dicing lanes intersect and a region beneath saw bow structure. A typical etching process for semiconductor device dicing is a deep-reactive ion etch (DRIE) process. An example DRIE process involves pulsing in two steps: in the first step, plasma etches a wafer along primarily a vertical direction, and, in the second step, a passivation layer (e.g., polytetrafluoroethylene) is chemically deposited on the silicon surface through use of a source gas (e.g., octafluorocyclobutane). The two steps are iterated in such a way that, after each surface passivation phase, an etch phase follows, during which ions attack selectively the passivation layer at the bottom of the trench being formed but not along the side walls. This iterative process permits deep vertical etching, but also affects the lateral walls and so the side is not perfectly planar, but rather is undulating.

The approximately horizontal lines across the image in FIG. 3 illustrate the undulations formed during plasma etch process. A larger vertical distance between the lines is representative of a faster etch in that region, while a smaller vertical distance is representative of a slower etch in that region, since the same amount of time occurs for each "layer" in the image. Region 310 is where another dicing lane intersects the dicing lane along the side of the plasma diced die (e.g., where dicing lanes 120 and 130 intersect). Due to the enhanced exchange of etchant gases in this region, the etch process proceeds faster. This is illustrated by a larger distance between the undulation lines near that area. This also results in etching getting to the lowest levels of the semiconductor material faster than the rest of the device wafer. Conversely, in a region 330 beneath and between saw bow legs 350 (e.g., corresponding to saw bow legs 150 from FIGS. 1 and 2A), the distance between undulation lines is significantly smaller, representing a slower etch between the narrowly spaced metal saw bow legs. Thus, a same number of etch steps does not etch as deeply between the saw bow legs as in the cross-over region. Along the remainder of the side of the diced die, the undulations have a consistent spacing between that of cross-over region 310 and saw bow region 330.

In order to provide a more consistent etch rate profile for plasma dicing, embodiments of the present invention utilize the slower etch rate experienced in the saw bow region to regulate the faster etch rate experienced in the dicing lane intersection area. As will be discussed more fully below, by utilizing differing geometries of the saw bow and the dicing lane (e.g., distance between saw bow legs, saw bow metal width, and chamfering of the corners of the dicing lane intersection), the etch rate in the cross-over region can be controlled to produce a uniform etch rate along the dicing lane.

Figure 4:
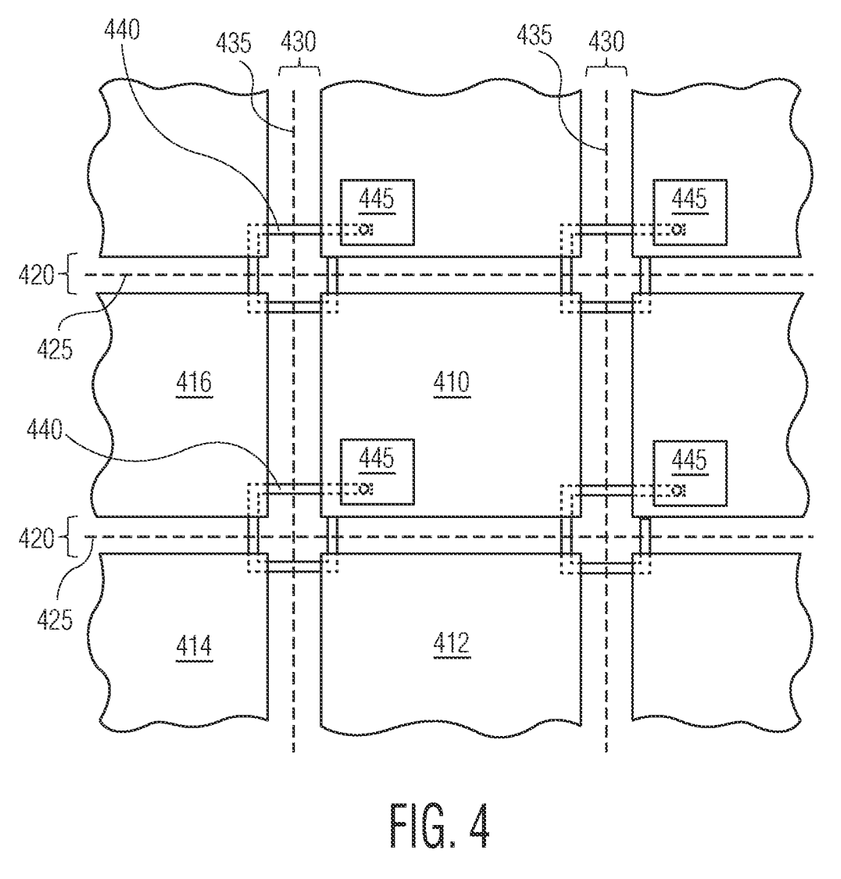
FIG. 4 is a simplified block diagram illustrating a portion of a semiconductor wafer 400 with individual integrated circuit dies formed thereon, with saw bow loops formed in dicing lane intersection regions.

FIG. 4 is a simplified block diagram illustrating a portion of a semiconductor wafer 400 with individual integrated circuit dies formed thereon. As with FIG. 1, the semiconductor wafer comprises a semiconductor substrate that can be any semiconductor material or combinations of materials, such as gallium arsenide, silicon germanium, silicon-on-insulator (501), silicon, monocrystalline silicon, the like, and combinations of the above.

FIG. 4 illustrates a repeating set of semiconductor device dies 410, 412, 414, and 416. During processing, dicing lanes (120, 130) are provided between each formed semiconductor device die. Plasma singulation, such as that described above, is performed along saw lines 425 and 435 in dicing lanes 420 and 430, respectively. Die 410 includes a saw bow that extends across the dicing lanes in a region where dicing lanes 120 and 130 intersect. Saw bow 440 electrically couples circuitry within device die 410 to a test pad 445 located on a surface of device die 410. Test pad 445 can be formed using the same techniques as described above for test pad 145. Saw bow 440 can also be formed without a test pad in order to couple integrated circuits within device die 410 for testing purposes. As in FIG. 1, the electrical paths of saw bow 440 are designed to be severed during singulation of the device dies from the wafer on which they are formed.

Saw bow 440 is an extension of a metal layer formed within device die 410 and is formed through a combination of deposition and patterning techniques, as known in the art. The saw bow extends from a first device die region 410, across dicing lane 430, and into a seal ring (not shown) of a neighboring device die region 416. A next leg of the saw bow extends from device die region 416, across dicing lane 420, and into the seal ring of neighboring device die region 414. A third leg of the saw bow extends from device die region 414, across dicing lane 430, and into the seal ring of neighboring device die region 412. Finally, a fourth leg of the saw bow extends from device die region 412, across dicing lane 420, and back into device die region 410. By extending the saw bow between seal rings of four neighboring device die, the saw bow metal is brought into proximity with the region that the plasma dicing process intersects.

When using a plasma dicing process, a width of the dicing lanes can be as small as about 4-10μ, especially as dimensions of device die continue to get smaller. A width of the saw bow metal can be 0.3μ or less, depending upon the technology used for wafer fabrication. The distance between legs of the saw bow, if extended perpendicularly across the dicing lanes, can be as small as the width of the dicing lanes. The distance between the saw bow legs can be made larger by having the legs placed away from the intersection. The distance between the saw bow legs can also be made smaller than the width of the dicing lanes through angling the metal toward the center of the intersection and then extending across the dicing lane. The distance between the saw bow legs can be chosen to regulate the etch rate in the cross-over region.

Figure 5:
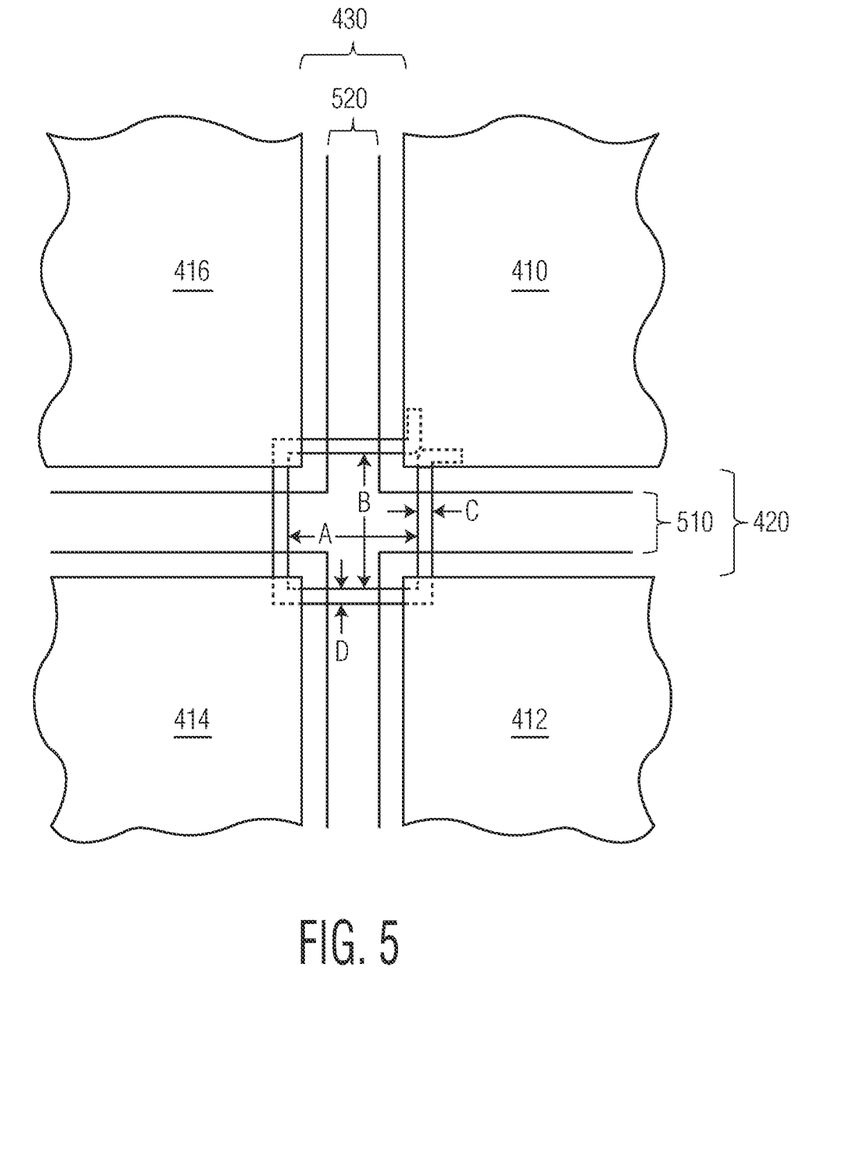
FIG. 5 is a simplified block diagram illustrating an example close-up plan view of an intersection region between dicing lanes having a saw bow loop.

FIG. 5 is a simplified block diagram illustrating a close-up plan view of an intersection region between dicing lanes 420 and 430 in accord with one embodiment of the present invention. Dicing lanes 420 and 430 are illustrated to include plasma etch regions 510 and 520, respectively. In a typical DRIE wafer dicing, the plasma etch regions are defined using a patterning method (e.g., photolithography). The width of etch regions 510 and 520 can be between 4-10μ, while the width of dicing lanes can be as narrow as the etch regions or larger, depending on the application. As discussed above, distances A and B between the legs of saw bow 440 can be adjusted, as well as thicknesses C and D of the saw bow metal, to adjust the etch rate within the cross-over region.

Figure 6:
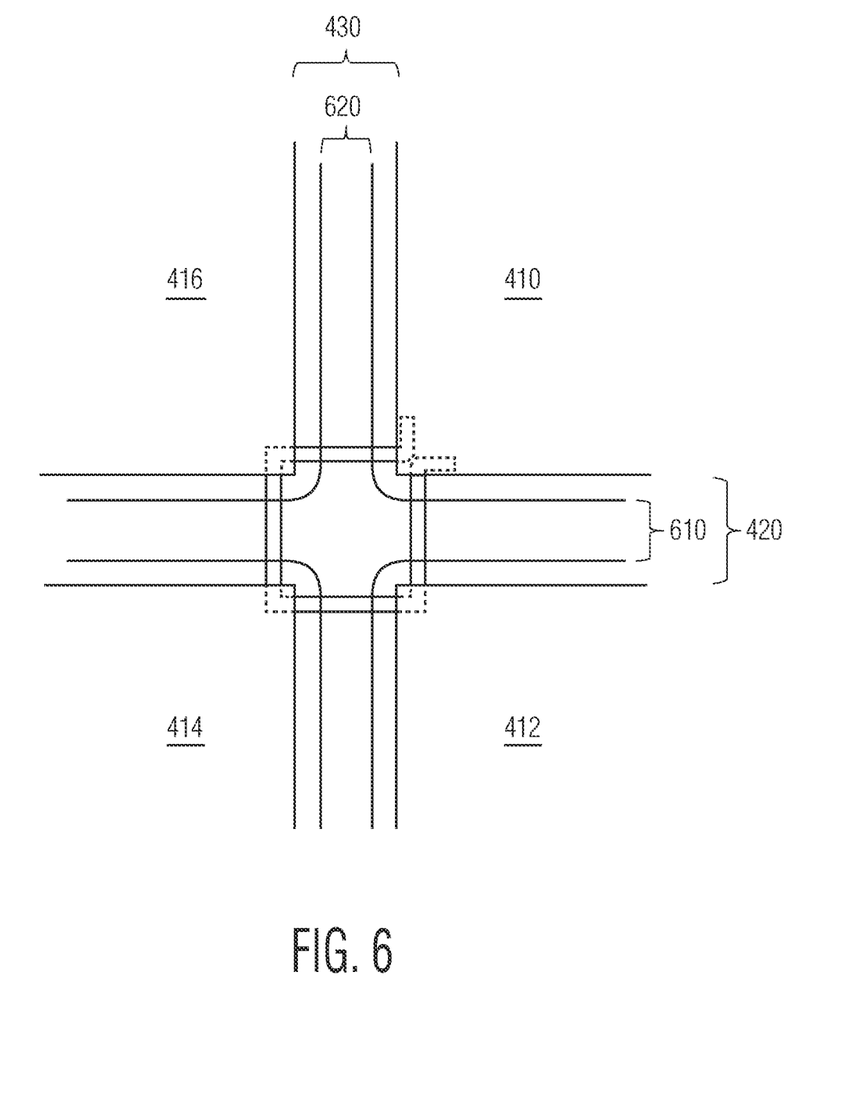
FIG. 6 is a simplified block diagram illustrating a close-up plan view of an example of intersection regions between dicing lanes having a saw bow loop.

FIG. 6 is a simplified block diagram illustrating a close-up plan view of an intersection regions between dicing lanes 420 and 430 in accord with an alternate embodiment of the present invention. As with FIG. 5, dicing lanes 420 and 430 are illustrated to include plasma etch regions 610 and 620, respectively. While dimensions can be the same in the embodiment of FIG. 6 as that of FIG. 5, the corners of the cross-over region are chamfered to result in curved corners for device die 410, 412, 414, and 416. Chamfering increases the area upon which the DRIE chemicals can interact during plasma etching, and therefore can increase speed of the etching in this region. Chamfer curvature radius is one of the variables that can be modified to increase or decrease the etch rate within the cross-over region, as necessitated by the application.

Figure 7:
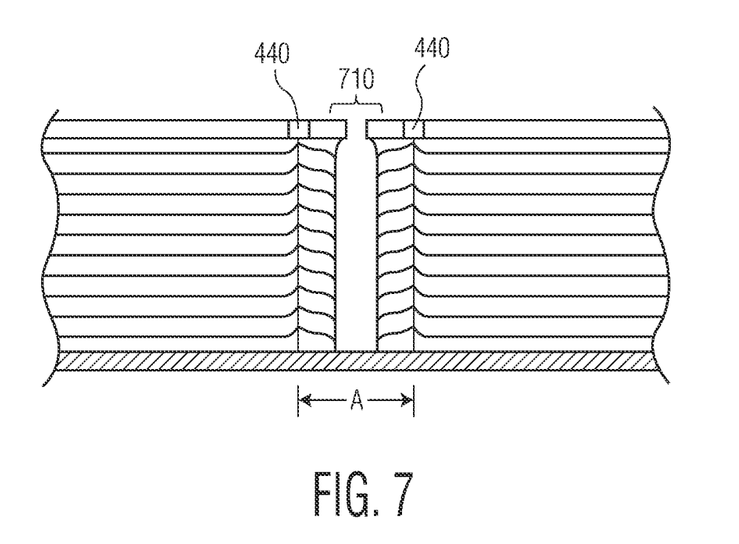
FIG. 7 is a simplified block diagram illustrating an example of an etching region along a side of a plasma diced die.

FIG. 7 is a simplified block diagram illustrating an example of an etching region along a side of a plasma diced die incorporating embodiments of the present invention. As with FIG. 3, the approximately horizontal lines across the figure are undulations formed during the plasma etch process. Region 710 is where another dicing lane intersects the dicing lane along the side of the plasma diced die (e.g., where 420 and 430 intersect). The presence of saw bow legs 440 in proximity with region 710 slows the etch rate within region 710 such that the etch rate across the illustrated region is consistent. By adjusting a parameter such as distance A between saw bow legs 440, the etch rate within the cross-over region can be controlled. Other parameters such as the type of plasma etching process, the type of etchant gases, the materials of the semiconductor device die, and the materials of the saw bow legs can also affect the etch rate. Therefore, the distances between the saw bow legs, the thickness of the saw bows, and amount of chamfering, as discussed above, will be different to control the etching rate.

Figure 8:
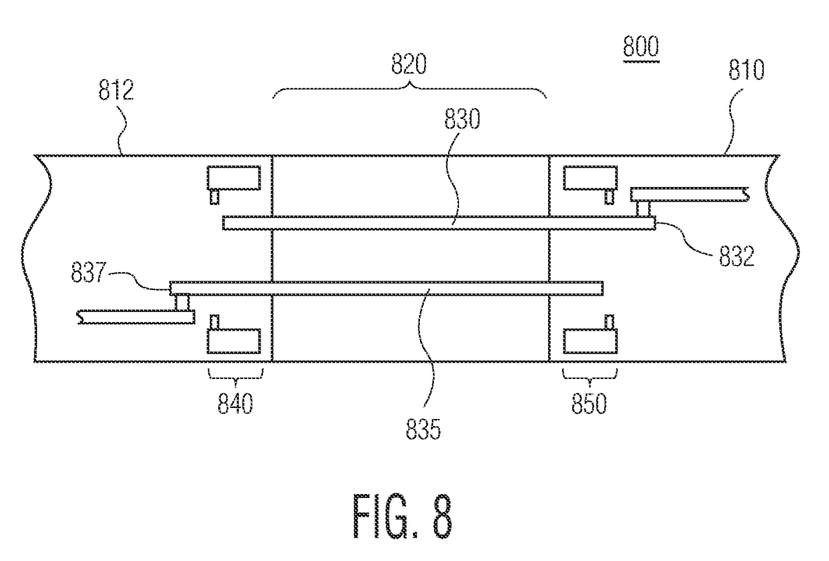
FIG. 8 is a simplified block diagram of a cross section of an example of intersection between dicing lanes illustrating two saw bows provided in different metal layers.

For applications requiring more than one saw bow passing from circuitry or pads on a device die, multiple saw bows can be provided in the intersection area. For example, saw bows can be provided using multiple metal layers in the dies at the dicing lane intersections. FIG. 8 is a simplified block diagram of a cross section 800 of an intersection between dicing lanes illustrating two saw bows provided in different metal layers. FIG. 8 provides a cross section of a dicing lane 820 adjacent to a die 810 and a die 812. Saw bow leg 830 extends across dicing lane 820 from die 810 to seal ring region 840 of die 812. Saw bow leg 830 is an extension of a first metal layer 832. Saw bow leg 835 extends across dicing lane 820 from die 812 to seal ring region 850 of die 810 and is an extension of a second metal layer 837. Depending on the nature of the application, more than two saw bows can be stacked vertically in the dicing lanes. Embodiments are not limited to a number of stacked saw bows. Further, saw bow legs need not be stacked directly above and below one another. Adjustments in alignment of the stacked saw bow legs can be performed to modify how the saw bows alter the etching rate in the dicing lane intersection region.

Figure 9:
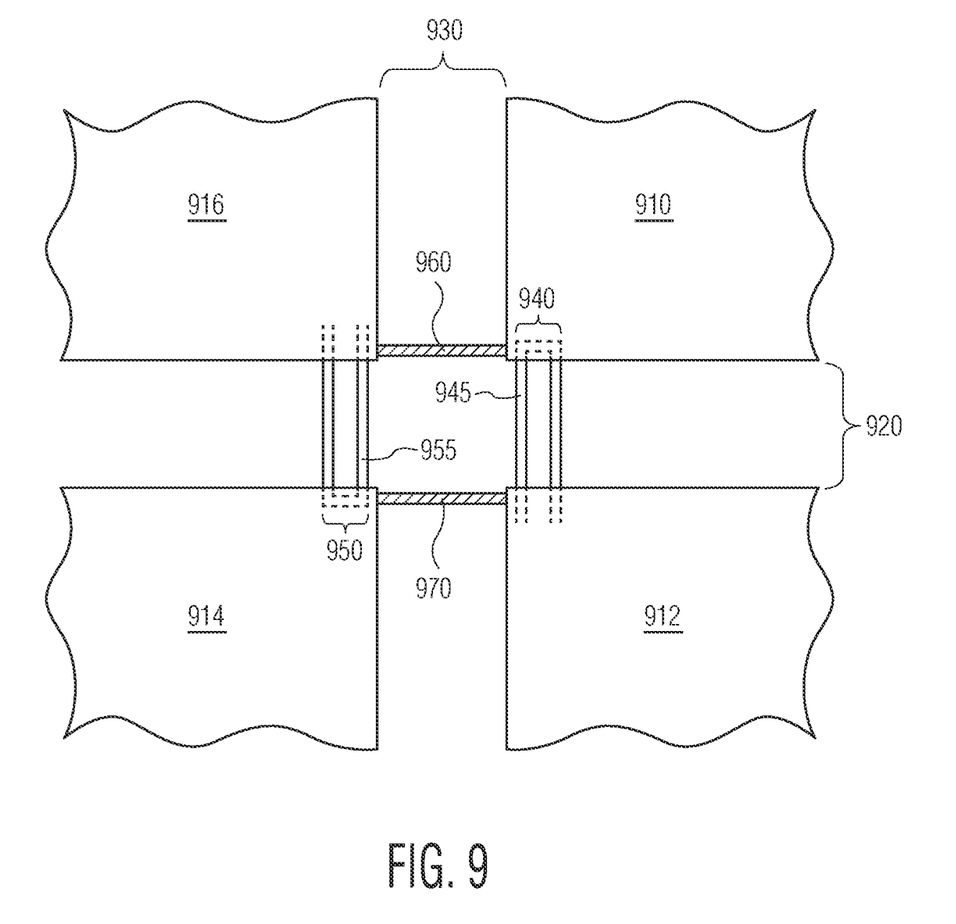
FIG. 9 is a simplified block diagram of a close-up plan view of an intersection region between dicing lanes 920 and 930 illustrating an alternative for providing multiple saw bows in an intersection region.

FIG. 9 is a simplified block diagram of a close-up plan view of an intersection region between dicing lanes 920 and 930 illustrating an alternative for providing multiple saw bows in an intersection region, in accord with one embodiment of the present invention. Between semiconductor device die 910 and 912 is a saw bow loop 940. Similarly, between semiconductor device die 914 and 916 is a saw bow loop 950. Saw bow loops 940 and 950 each have a conductive "leg," 945 and 955 respectively, near the intersection of dicing lanes 920 and 930. In addition, two dummy regions 950 and 960 are formed near the intersection of the dicing lanes. Dummy regions 950 and 960 are not saw bows but are formed of a material that can regulate the etch rate in the intersection region. The material can be the same as that used for saw bows (e.g., a conductive metal) or of another material that affects etch rate, such as, for example, silicon oxide or a photoresist. In the illustrated configuration, saw bow legs 944 and 955 and dummy regions 960 and 970 reduce the etch rate in dicing lanes that pass through the intersection region, in the same manner as discussed above.

Embodiments provide additional metal in the intersection region between plasma dicing lanes to regulate the plasma etch speed. As an alternative to saw bow loops, dummy regions formed of metal or other plasma etch barrier materials can be formed in the intersection regions to regulate the etch rate from the crossed over dicing lanes. By regulating the etch rate in the intersection region in the manner described, more predictable timing of plasma dicing can result, providing greater reliability of device die, and more consistent dicing times.

By now it should be appreciated that there has been provided a semiconductor wafer having a plurality of semiconductor device die arranged in a grid pattern. The semiconductor wafer includes a first semiconductor device die neighboring a second the semiconductor device die and separated from the second semiconductor device die by a first dicing lane, a third semiconductor device die neighboring the first semiconductor device die and separated from the first semiconductor device die by a second dicing lane. The first and second dicing lanes intersect at an intersection region and are substantially perpendicular. A fourth semiconductor device die neighbors the second semiconductor device die and is separated from the second semiconductor device die by the second dicing lane, as well as neighboring the third semiconductor device die being separated from the third semiconductor device die by the first dicing lane. The semiconductor wafer further includes a first conductor. The first conductor includes: a first portion of the first conductor extending from a side of the first semiconductor device die into the first dicing lane and extending toward the second semiconductor device die, entering the second semiconductor device die, and extending into a seal ring region of the second semiconductor device die; a second portion of the first conductor extending from a side of the second semiconductor device die into the second dicing lane and extending toward the fourth semiconductor device die, entering the fourth semiconductor device die, and extending into a seal ring region of the fourth semiconductor device die; a third portion of the first conductor extending from a side of the fourth semiconductor device die into the first dicing lane and extending toward the third semiconductor device die, entering the third semiconductor device die, and extending into a seal ring region of the third semiconductor device die; and, a fourth portion of the first conductor extending from a side of the third semiconductor device die into the second dicing lane and extending toward the first semiconductor device die, entering the first semiconductor device die, and extending into a seal ring region of the first semiconductor device die, where the first conductor is formed approximate two corners of the first, second, third, and fourth semiconductor device die forming the intersection region.

In one aspect of the above embodiment, the first conductor forms a circuit between the first, second, third, and fourth portions of the first conductor. In a further aspect, the first conductor is formed from a first metal layer of one or more metal layers implemented on the semiconductor wafer. In still another aspect, the first portion of the first conductors formed from a first metal layer of one or more metal layers implemented on the semiconductor wafer, one or more of the second, third, and fourth portions of the first conductor are formed from a second metal layer of the one or more metal layers, and the second metal layer is a different metal layer than the first metal layer. Another further aspect includes a conductive pad on a surface of the first semiconductor device die where the conductive pad is electrically coupled to the first portion of the first conductor, and a circuit in the first semiconductor device die where the circuit is electrically coupled to the fourth portion of the first conductor.

In another aspect, the first conductor is configured to reduce a plasma etching rate in the intersection region during plasma dicing of the first, second, third, and fourth semiconductor device dies.

In another aspect, the semiconductor wafer further includes a second conductor. The second conductor includes: a first portion extending from a side of the second semiconductor device die into the second dicing lane and extending toward the fourth semiconductor device die, entering the fourth semiconductor device die, and extending into a seal ring region of the fourth semiconductor device die; a second portion of the second conductors extending from a side of the fourth semiconductor device die into the first dicing lane and extending toward the third semiconductor device die, entering the third semiconductor device die, and extending into a seal ring region of the third semiconductor device die; a third of portion of the second conductor extending from a side of the third semiconductor device die into the second dicing lane and extending toward the first semiconductor device die, entering the first semiconductor device die, and extending into a seal ring region of the first semiconductor device die; and, a fourth portion of the second conductor extending from a side of the first semiconductor device die into the first dicing lane and extending toward the second semiconductor device die, entering the second semiconductor device die, and extending into a seal ring region of the second semiconductor device die. The second conductor is formed proximate to corners of the first, second, third, and fourth semiconductor device die forming the intersection region, and the second conductor is formed from one or more metal layers distinct from the first conductor.

In a further aspect, the second conductor forms a circuit between the first, second, third, and fourth portions of the second conductor. In another aspect, the second conductor is below and aligned with the first conductor. In yet another aspect, the second conductor is below and not aligned with the first conductor.

Another embodiment provides a method of regulating plasma etch rate in an intersection region between two dicing lanes. The method includes forming integrated circuitry within one or more metal layers on a wafer. The integrated circuitry is arranged in a grid pattern of a plurality of device die regions including a first semiconductor device die region, a second semiconductor device die region, a third semiconductor device die region, and a fourth semiconductor device die region. The first semiconductor device die region neighbors the second semiconductor device die region and is separated from the second semiconductor device die region by a first dicing lane. The third semiconductor device die region neighbors the first semiconductor device die region and is separated from the first semiconductor device die region by second dicing lane where the first and second dicing lanes intersect at the intersection region. The fourth semiconductor device die region neighbors the second semiconductor device die region and is separated from the second semiconductor device die region by the second dicing lane and the fourth semiconductor device die region neighbors the third semiconductor device die region and is separated from the third semiconductor device die region by the first dicing lane. The method further includes forming a first set of conductors proximate to corners of the first, second, third, and fourth semiconductor device die forming the intersection region. The first set of conductors includes: a first conductor extending from a side of the first semiconductor device die into the first dicing lane and extending toward the second semiconductor device die, entering the second semiconductor device die, and an extending into a seal ring region of the second semiconductor device die; a second conductor extending from a side of the second semiconductor device die into the second dicing lane and extending toward the fourth semiconductor device die, entering the fourth semiconductor device die, and extending into a seal ring region of the fourth semiconductor device die; a third conductor extending from a side of the fourth semiconductor device die into the first dicing lane and extending toward the third semiconductor device die, entering the third semiconductor device die, and extending into a seal ring region of the third similar device die; and, a fourth conductor extending from a side of the third semiconductor device die into the second dicing lane and extending toward the first semiconductor device die, entering the first semiconductor device die, and extending into a seal ring region of the first semiconductor device die.

In one aspect of the above embodiments, the first of the conductors form a circuit between the first, second, third, and fourth conductors. In a further aspect, the method further includes forming each of the first set of conductors as a single conductor from a metal layer of one or more metal layers implemented on the semiconductor wafer. In another aspect, the method further includes forming one or more of the second, third, and fourth conductors in a different metal layer of one or more metal layers implemented on the semiconductor wafer than that of the first conductor. In another aspect, the method further includes forming a circuit in the first semiconductor device die and electrically coupling the circuit to a conductor of the first set of conductors.

In another aspect the method further includes forming the first set of conductors such that a plasma etching rate in the intersection region during plasma dicing of the first, second, third, and fourth semiconductor device dies is reduced.

In yet another aspect, the method further includes forming a second set of conductors proximate to the corners of the first, second, third, and fourth semiconductor device die at the intersection region. The second set of conductors includes: ⅕ conductor extending from a side of the second semiconductor device die into the second dicing lane and extending toward the fourth semiconductor device die, entering the fourth semiconductor device die, and extending into the seal ring region of the fourth semiconductor device die; a sixth conductor extending from a side of the fourth semiconductor device die into the first dicing lane and extending toward the third simulacra device die, entering the third semiconductor device die, and extending into the seal ring region of the third semiconductor device die; a seventh conductor extending from a side of the third semiconductor device die into the second the dicing lane and extending toward the first semiconductor device die, entering the first semiconductor device die, and extending into the seal ring region of the first semiconductor device die; and, an eighth conductor extending from a side of the first semiconductor device die into the first dicing lane and extending toward the second semiconductor device die, entering the second semiconductor device die, and extending into the seal ring region of the second semiconductor device die. The second set of conductors are within a metal layer distinct from the first set of conductors.

In a further aspect, the second set of conductors form a circuit between the fifth, sixth, seventh, and eighth conductors. In another further aspect, the method further includes forming each of the second set of conductors below and aligned with the first set of conductors. In yet another further aspect, the method further includes forming each of the second set of conductors below and not aligned with the first set of conductors.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is further noted that the term "neighboring" as used herein means "adjacent to" (e.g., next to and without an intervening object), and "laterally" as used herein means "in a sideways direction" (e.g., a horizontal direction that is parallel to a plane of the substrate).

As used herein, the terms "approximately" and "about" mean a value close to or within an acceptable range of an indicated value, amount, or quantity, which also includes the exact indicated value itself.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein regarding specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of regulating plasma etch rate in an intersection region between two dicing lanes, the method comprising:
   forming integrated circuitry within one or more metal layers on a wafer, wherein
   the integrated circuitry is arranged in a grid pattern of a plurality of device die regions including a first semiconductor device die region, a second semiconductor device die region, a third semiconductor device die region, and a fourth semiconductor device die region, and
   the first semiconductor device die region neighbors the second semiconductor device die region and is separated from the second semiconductor device die region by a first dicing lane,
   the third semiconductor device die region neighbors the first semiconductor device die region and is separated from the first semiconductor device die region by a second dicing lane, wherein the first and second dicing lanes intersect at the intersection region,
   the fourth semiconductor device die region neighbors the second semiconductor device die region and is separated from the second semiconductor device die region by the second dicing lane and the fourth semiconductor device die region neighbors the third semiconductor device die region and is separated from the third semiconductor device die region by the first dicing lane; and
   forming a first conductor having a continuous shape and coupled to circuitry of the first semiconductor device die, the first conductor comprising:
   a first portion of the first conductor extending from the circuitry of the first semiconductor device die at a first side of the first semiconductor device die into the first dicing lane and extending toward the second semiconductor device die, entering the second semiconductor device die at a first side, and extending into a seal ring region of the second semiconductor device die,
   a second portion of the first conductor extending from the seal ring region of the second semiconductor device die at a second side of the second semiconductor device die different from the first side of the second semiconductor device into the second dicing lane and extending toward the fourth semiconductor device die, entering the fourth semiconductor device die at a first side, and extending into a seal ring region of the fourth semiconductor device die,
   a third portion of the first conductor extending from the seal ring region of the fourth semiconductor device die at a second side of the fourth semiconductor device die different from the first side of the fourth semiconductor device into the first dicing lane and extending toward the third semiconductor device die, entering the third semiconductor device die at a first side, and extending into a seal ring region of the third semiconductor device die, and
   a fourth portion of the first conductor extending from the seal ring region of the third semiconductor device die at a second side of the third semiconductor device die different from the first side of the third semiconductor device into the second dicing lane and extending toward the first semiconductor device die, entering the first semiconductor device die, and extending into a seal ring region of the first semiconductor device die,
   wherein the first, second, third, and fourth portions of the first conductor together form the continuous shape of the first conductor.

2. The method of claim 1, wherein the first set of conductors form a circuit path between the first, second, third, and fourth portions of the first conductor.

3. The method of claim 1, wherein the first conductor is formed from a first metal layer of one or more metal layers implemented on the semiconductor wafer.

4. The method of claim 1, wherein the first portion of the first conductor is formed from a first metal layer of one or more metal layers implemented on the semiconductor wafer, and one or more of the second, third, and fourth portions of the first conductor are formed from a second metal layer of one or more metal layers implemented on the semiconductor wafer, the second metal layer is a different metal layer than that of the first metal layer.

5. The method of claim 1, further comprising:
   forming a conductive pad on a surface of the first semiconductor device die, wherein the conductive pad is electrically coupled to the first portion of the first conductor; and
   conductively coupling a circuit in the first semiconductor device die with the first portion of the first conductor.

6. The method of claim 1, further comprising forming the first conductor such that a plasma etching rate in the intersection region during plasma dicing of the first, second, third, and fourth semiconductor device dies is reduced.

7. The method of claim 1 further comprising:
   forming a second conductor having a continuous shape and proximate to the corners of the first, second, third, and fourth semiconductor device die at the intersection region, the second conductor comprising:
   a first portion of the second conductor extending from the second side of the second semiconductor device die into the second dicing lane and extending toward the fourth semiconductor device die, entering the fourth semiconductor device die at the first side, and extending into the seal ring region of the fourth semiconductor device die,
   a second portion of the second conductor extending from the second side of the fourth semiconductor device die into the first dicing lane and extending toward the third semiconductor device die, entering the third semiconductor device die at the first side, and extending into the seal ring region of the third semiconductor device die,
   a third portion of the second conductor extending from the second side of the third semiconductor device die into the second dicing lane and extending toward the first semiconductor device die, entering the first semiconductor device die at a second side different from the first side of the first semiconductor device, and extending into the seal ring region of the first semiconductor device die, and
   a fourth portion of the second conductor extending from the first side of the first semiconductor device die into the first dicing lane and extending toward the second semiconductor device die, entering the second semiconductor device die at the first side, and extending into the seal ring region of the second semiconductor device die, and
      wherein the second conductor is formed from one or more metal layers distinct from the first conductor.

8. The method of claim 7, wherein the second conductor forms a circuit between the first, second, third, and fourth portions of the second conductor.

9. The method of claim 7, wherein the second conductor is below and aligned with the first conductor.

10. The method of claim 7, wherein the second conductor is below and not aligned with the first conductor.

11. A method of regulating plasma etch rate in an intersection region between two dicing lanes, the method comprising:
   forming integrated circuitry arranged in a grid pattern of a plurality of semiconductor device die on a semiconductor wafer, the semiconductor wafer comprising:
      a first semiconductor device die neighboring a second semiconductor device die, and separated from the second semiconductor device die by a first dicing lane;
      a third semiconductor device die neighboring the first semiconductor device die, and separated from the first semiconductor device die by a second dicing lane, wherein the first and second dicing lanes intersect at an intersection region and are substantially perpendicular;
      a fourth semiconductor device die, wherein:
         the fourth semiconductor device die neighbors the second semiconductor device die, and separated from the second semiconductor device die by the second dicing lane, and
         the fourth semiconductor device die neighbors the third semiconductor device die, and separated from the third semiconductor device die by the first dicing lane; and
   forming a first conductor having a continuous shape and coupled to circuitry of the first semiconductor device die, the first conductor comprising:
      a first portion of the first conductor extending from the circuitry of the first semiconductor device die at a first side of the first semiconductor device die into the first dicing lane and extending toward the second semiconductor device die, entering the second semiconductor device die at a first side, and extending into a seal ring region of the second semiconductor device die,
      a second portion of the first conductor extending from the seal ring region of the second semiconductor device die at a second side of the second semiconductor device die different from the first side of the second semiconductor device into the second dicing lane and extending toward the fourth semiconductor device die, entering the fourth semiconductor device die at a first side, and extending into a seal ring region of the fourth semiconductor device die,
      a third portion of the first conductor extending from the seal ring region of the fourth semiconductor device die at a second side of the fourth semiconductor device die different from the first side of the fourth semiconductor device into the first dicing lane and extending toward the third semiconductor device die, entering the third semiconductor device die at a first side, and extending into a seal ring region of the third semiconductor device die, and
      a fourth portion of the first conductor extending from the seal ring region of the third semiconductor device die at a second side of the third semiconductor device die different from the first side of the third semiconductor device into the second dicing lane and extending toward the first semiconductor device die, entering the first semiconductor device die, and extending into a seal ring region of the first semiconductor device die,
      wherein the first, second, third, and fourth portions of the first conductor together form the continuous shape of the first conductor.

12. The method of claim 11, wherein the first conductor forms a circuit path between the first, second, third, and fourth portions of the first conductor.

13. The method of claim 11, wherein the first conductor is formed from a first metal layer of one or more metal layers implemented on the semiconductor wafer.

14. The method of claim 11, wherein:
the first portion of the first conductor is formed from a first metal layer of one or more metal layers implemented on the semiconductor wafer;
one or more of the second, third, and fourth portions of the first conductor are formed from a second metal layer of the one or more metal layers; and
the second metal layer is a different metal layer than the first metal layer.

15. The method of claim 11, further comprising:
forming a conductive pad on a surface of the first semiconductor device die, wherein the conductive pad is electrically coupled to the first portion of the first conductor; and
conductively coupling a circuit in the first semiconductor device die with the first portion of the first conductor.

16. The method of claim 11, further comprising forming the first conductor such that a plasma etching rate in the intersection region during plasma dicing of the first, second, third, and fourth semiconductor device dies is consistent with a plasma etching rate in the first and second dicing lanes outside of the intersection region.

17. The method of claim 11, further comprising forming a second conductor having a continuous shape, the second conductor comprising:
a first portion of the second conductor extending from the second side of the second semiconductor device die into the second dicing lane and extending toward the fourth semiconductor device die, entering the fourth semiconductor device die at the first side, and extending into the seal ring region of the fourth semiconductor device die,
a second portion of the second conductor extending from the second side of the fourth semiconductor device die into the first dicing lane and extending toward the third semiconductor device die, entering the third semiconductor device die at the first side, and extending into the seal ring region of the third semiconductor device die,
a third portion of the second conductor extending from the second side of the third semiconductor device die into the second dicing lane and extending toward the first semiconductor device die, entering the first semiconductor device die at a second side different from the first side of the first semiconductor device, and extending into the seal ring region of the first semiconductor device die, and
a fourth portion of the second conductor extending from the first side of the first semiconductor device die into the first dicing lane and extending toward the second semiconductor device die, entering the second semiconductor device die at the first side, and extending into the seal ring region of the second semiconductor device die, wherein:
the second conductor is formed proximate to corners of the first, second, third, and fourth semiconductor device die forming the intersection region, and
the second conductor is formed from one or more metal layers distinct from the first conductor.

18. The method of claim 17, wherein the second conductor forms a circuit between the first, second, third, and fourth portions of the second conductor.

19. The method of claim 17, wherein the second conductor is below and aligned with the first conductor.

20. The method of claim 17, wherein the second conductor is below and not aligned with the first conductor.

* * * * *